(12) United States Patent
Martin et al.

(10) Patent No.: US 9,950,517 B2
(45) Date of Patent: Apr. 24, 2018

(54) DETECTING A DRIVE BUBBLE FORMATION AND COLLAPSE

(71) Applicant: HEWLETT-PACKARD DEVELOPMENT COMPANY, L.P., Houston, TX (US)

(72) Inventors: Eric T. Martin, Corvallis, OR (US); Andrew L. Van Brocklin, Corvallis, OR (US); David Maxfield, Philomath, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/170,588

(22) Filed: Jun. 1, 2016

(65) Prior Publication Data

US 2016/0271940 A1 Sep. 22, 2016

Related U.S. Application Data

(63) Continuation of application No. 14/372,729, filed as application No. PCT/US2012/034231 on Apr. 19, 2012, now Pat. No. 9,409,393.

(51) Int. Cl.
*B41J 2/045* (2006.01)
*B41J 2/14* (2006.01)
*G01R 27/02* (2006.01)

(52) U.S. Cl.
CPC ......... *B41J 2/04541* (2013.01); *B41J 2/0451* (2013.01); *B41J 2/0458* (2013.01); *B41J 2/14153* (2013.01); *G01R 27/02* (2013.01); *B41J 2002/14354* (2013.01)

(58) Field of Classification Search
CPC .. B41J 2/04541; B41J 2/0451; B41J 2/14153; B41J 2/0458; B41J 2002/14354; G01R 27/02
See application file for complete search history.

(56) References Cited

U.S. PATENT DOCUMENTS

| | | | |
|---|---|---|---|
| 5,255,021 A * | 10/1993 | Noguchi | B41J 2/0451 324/522 |
| 5,633,678 A | 5/1997 | Parulski | |
| 6,234,599 B1 * | 5/2001 | Ishinaga | B41J 2/0451 347/14 |
| 6,257,694 B1 | 7/2001 | Tokumaru et al. | |
| 8,011,748 B2 | 9/2011 | North | |
| 8,950,837 B2 * | 2/2015 | Maeda | B41J 29/393 347/5 |
| 2004/0191988 A1 | 9/2004 | Sandhu et al. | |
| 2006/0071955 A1 * | 4/2006 | Arazaki | B41J 2/17546 347/5 |
| 2007/0194371 A1 | 8/2007 | Benjamin | |
| 2009/0040258 A1 | 2/2009 | Baek | |

(Continued)

FOREIGN PATENT DOCUMENTS

| | | |
|---|---|---|
| CN | 101362400 A | 2/2009 |
| JP | 11334102 | 12/1999 |

(Continued)

*Primary Examiner* — Yaovi M Ameh
(74) *Attorney, Agent, or Firm* — Fabian VanCott

(57) ABSTRACT

Measuring an inkjet nozzle may include taking at least one impedance measurement after the firing command is sent to detect the presence of a drive bubble and taking another impedance measurement to detect a collapse of the drive bubble.

19 Claims, 6 Drawing Sheets

(56) References Cited

U.S. PATENT DOCUMENTS

| | | | |
|---|---|---|---|
| 2009/0067256 A1 | 3/2009 | Bhattacharyya et al. | |
| 2011/0084997 A1* | 4/2011 | Chen .................... | B41J 2/14153 |
| | | | 347/14 |
| 2014/0218436 A1 | 8/2014 | Ge et al. | |

FOREIGN PATENT DOCUMENTS

| | | |
|---|---|---|
| JP | 2005-199600 A | 7/2005 |
| JP | 2007210296 | 8/2007 |
| WO | WO-2007019046 | 2/2007 |

* cited by examiner

DETECTING A DRIVE BUBBLE FORMATION AND COLLAPSE

BACKGROUND

In inkjet printing, ink droplets are released from an array of nozzles in a print head onto a printing medium, such as paper. The ink bonds to a surface of the printing medium and forms graphics, text, or other images. The ink droplets are released with precision to ensure that the image is accurately formed. Generally, the medium is conveyed under the print head while the droplets are selectively released. The medium's conveyance speed is factored into the droplet release timing.

Some inkjet printers include print heads that slide laterally across a swath, or width, of the printing medium during a print job. In such printers, the medium's conveyance is halted momentarily as the print head travels and releases the predetermined droplets along the swath of the medium. Other inkjet printers include print heads that remain stationary throughout a printing job. In these printers, an array of nozzles generally spans the entire swath of the printing medium.

Print heads typically include a number of ink chambers, also known as firing chambers. Each ink chamber is in fluid communication with one of the nozzles in the array and provides the ink to be deposited by that respective print head nozzle. Prior to a droplet release, the ink in the ink chamber is restrained from exiting the nozzle due to capillary forces and/or back-pressure acting on the ink within the nozzle passage. The meniscus, which is a surface of the ink that separates the liquid ink in the chamber from the atmosphere located below the nozzle, is held in place due to a balance of the internal pressure of the chamber, gravity, and the capillary force. The size of the nozzle passage is a contributing factor to the strength of the capillary forces. The internal pressure within the ink chamber is generally insufficient to exceed the strength of the capillary force, and thus, the ink is prevented from exiting the ink chamber through the nozzle passage without actively increasing the pressure within the chamber.

During a droplet release, ink within the ink chamber is forced out of the nozzle by actively increasing the pressure within the chamber. Some print heads use a resistive heater positioned within the chamber to evaporate a small amount of at least one component of the liquid ink. In many cases, a major component of the liquid ink is water, and the resistive heater evaporates the water. The evaporated ink component or components expand to form a gaseous drive bubble within the ink chamber. This expansion exceeds the restraining force enough to expel a single droplet out of the nozzle. Generally, after the release of single droplet, the pressure in the ink chamber drops below the strength of the restraining force and the remainder of the ink is retained within the chamber. Meanwhile, the drive bubble collapses and ink from a reservoir flows into the ink chamber replenishing the lost ink volume from the droplet release. This process is repeated each time the print head is instructed to fire.

BRIEF DESCRIPTION OF THE DRAWINGS

The accompanying drawings illustrate various examples of the principles described herein and are a part of the specification. The illustrated examples are merely examples and do not limit the scope of the claims.

DETAILED DESCRIPTION

As used herein, a drive bubble is a bubble formed from within an ink chamber to dispense a droplet of ink as part of a printing job or a servicing event. The drive bubble may be made of a vaporized ink separated from liquid ink by a bubble wall. The timing of the drive bubble formation may be dependent on the image to be formed on the printing medium.

The present specification describes subject matter including, for example, a method for detecting an inkjet drive bubble. Examples of such a method include taking an impedance measurement after a firing command is sent to an ink chamber to detect the presence of a drive bubble and taking another impedance measurement to detect a collapse of the drive bubble. Finding a drive bubble formation time and a drive bubble collapse time may be used to calibrate sensing programs that determine the health of the inkjet nozzles.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described is included in at least that one example, but not necessarily in other examples.

Figure 1:
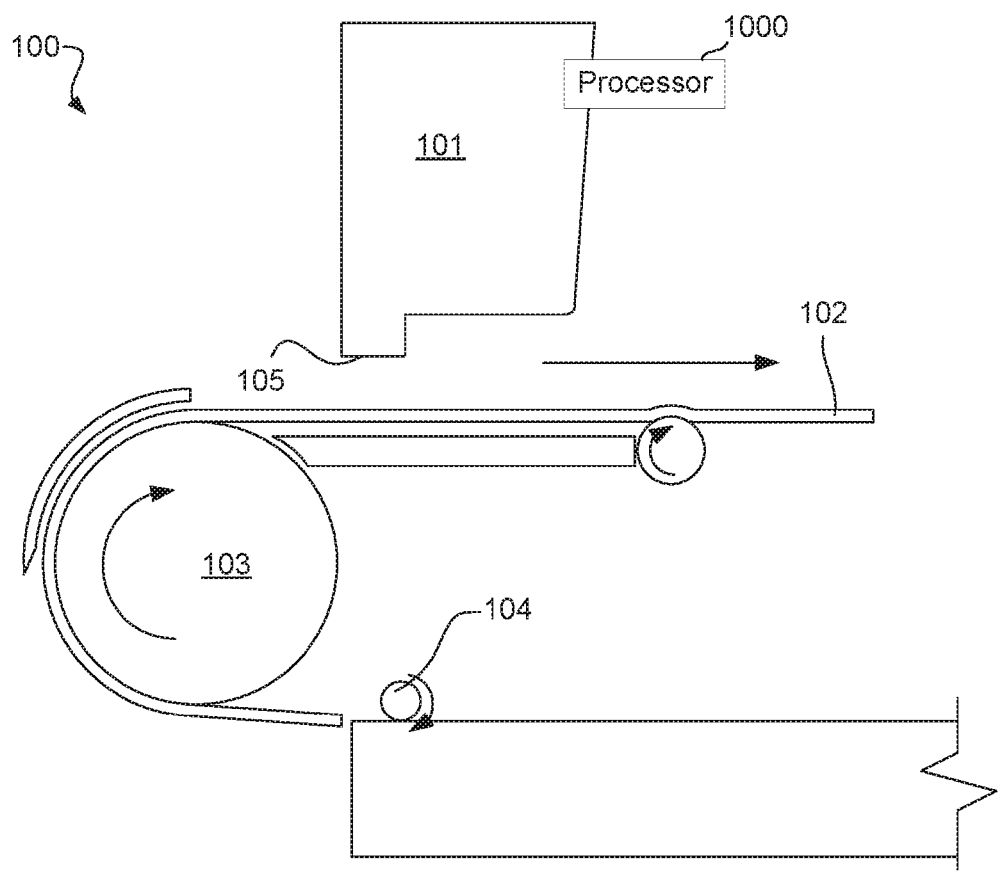
FIG. 1 is a diagram of illustrative components of a printer, according to principles described herein.

FIG. 1 is a diagram of illustrative components of a printer (100), according to principles described herein. In this example, the printer (100) includes a print head (101) positioned over a printing medium (102) traveling through the printer (100). The printer (100) further comprises a processor (1000) that is in communication with the print head (101) and is programmed to use sensors within the print head (10) to detect the formation and collapse of drive bubbles, as will be described in further detail below.

The printing medium (102) is pulled from a stack of media individually through the use of rollers (103, 104). In other examples, the printing medium is a continuous sheet or web. The printing medium may be, but is not limited to, paper, cardstock, poster board, vinyl, translucent graphics medium, other printing media, or combinations thereof.

The print head (101) may have a number of nozzles formed in its underside (105). Each nozzle may be in electrical communication with a processor that instructs the nozzles to fire at specific times by activating a heater within the ink chambers associated with each nozzle. The heater may be a heating element, resistive heater, a thin-film resistor, other mechanism that may create a bubble within the ink chamber, or combinations thereof. In other examples, a piezo-electric element may create pressure in the ink chamber to file a desired nozzle.

Figure 2:
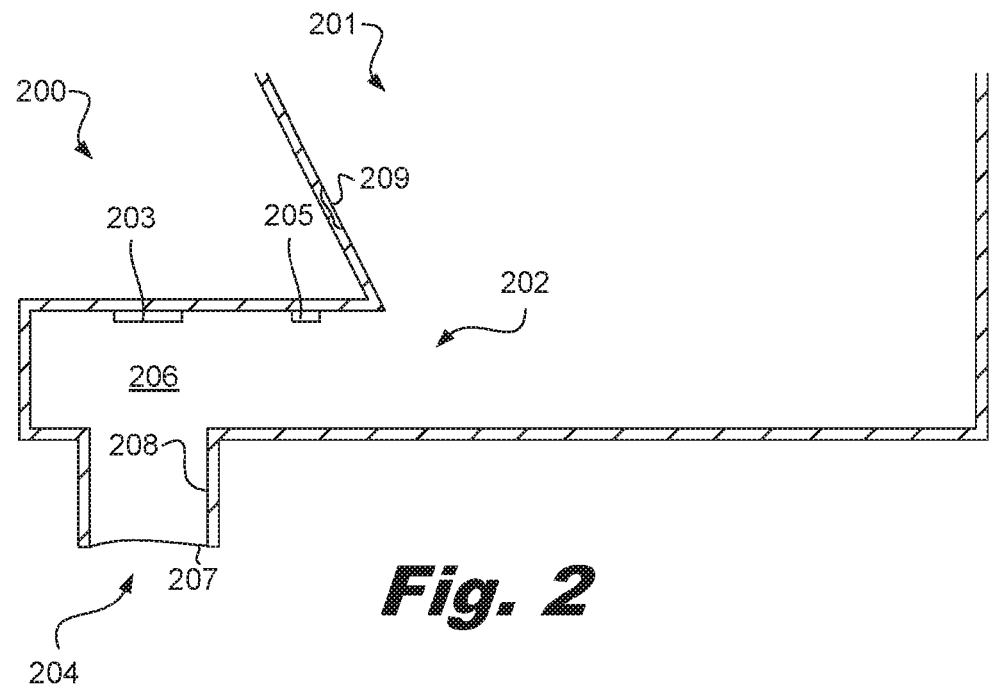
FIG. 2 is a cross sectional diagram of an illustrative ink chamber, according to principles described herein.

FIG. 2 is a cross sectional diagram of an illustrative ink chamber (200), according to principles described herein. In this example, the ink chamber (200) is connected to an ink reservoir (201) through an inlet (202). A heater (203) is positioned over the nozzle (204). An impedance sensor (205) is positioned near the heater (203). Capillary forces cause the ink to form a meniscus (207) within a passage (208) of the nozzle (204). The meniscus is a barrier between the liquid ink (206) in the chamber (200) and the atmosphere located below the nozzle (204). The internal pressure within the ink chamber (200) is not sufficient to move ink out of the chamber (200) unless the chamber's internal pressure is actively increased.

The impedance sensor (205) may have a plate made of a material of a predetermined resistance. In some examples, the plate is made of metal, tantalum, copper, nickel, titanium, or combinations thereof. In some examples, the material is capable of withstanding corrosion due to the material's contact with the liquid ink (206). A ground element (209) may also be located anywhere within the ink chamber (200) or ink reservoir (201). In the example of FIG. 2, the ground element (209) is depicted in the ink reservoir (201). In some examples, the ground element is an etched portion of a wall with a grounded electrically conductive material exposed. In other examples, the ground element (209) may be a grounded electrical pad. When, in the presence of liquid ink (206), a voltage is applied to the impedance sensor (205), an electrical current may pass from the impedance sensor (205) to the ground element (209).

The liquid ink (206) may be more conductive than the air or other gasses in the drive bubble. In some examples, the liquid ink contains partly aqueous vehicle mobile ions. In such examples, when a portion of the sensor's surface area is in contact with the liquid ink (206) and when a current pulse or voltage pulse is applied to the sensor (205), the sensor's impedance is lower than it would otherwise be without the ink's contact. On the other hand, when an increasingly larger amount of the sensor's surface area is in contact with the gases of a drive bubble and a voltage or current of the same strength is applied to the sensor (205), the sensor's impedance increases. The sensor (205) may be used to make a measurement of some component of impedance, such as the resistive (real) components at a frequency range determined by the type of voltage source supplying the voltage or current to the sensor. In some examples, a cross sectional geometry of the drive bubble or stray bubbles along the electrical path between the impedance sensor (205) and the ground element (209) may also affect the impedance value.

FIGS. 3-6 depict an illustrative healthy inkjet nozzle during an ink droplet release. A healthy inkjet nozzle is a nozzle that is associated with an ink chamber, heater, and other components that are free of issues that would cause the nozzle to fire improperly. An improperly firing nozzle includes a nozzle that fails to fire at all, fires early, fires late, releases too much ink, releases too little ink, or combinations thereof.

FIGS. 3-6 depict the stages of the drive bubble from its formation to its collapse. These depictions are merely illustrative. Bubble size and geometry are determined by the factors such as an amount of heat generated by the heater, the internal pressure of the ink chamber, the amount of ink in the ink reservoir, the viscosity of the liquid ink, the ion concentration of the ink, the geometry of the ink chamber, volume of the ink chamber, the diameter size of the nozzle passage, the position of the heater, other factors, or combinations thereof.

Figure 3:
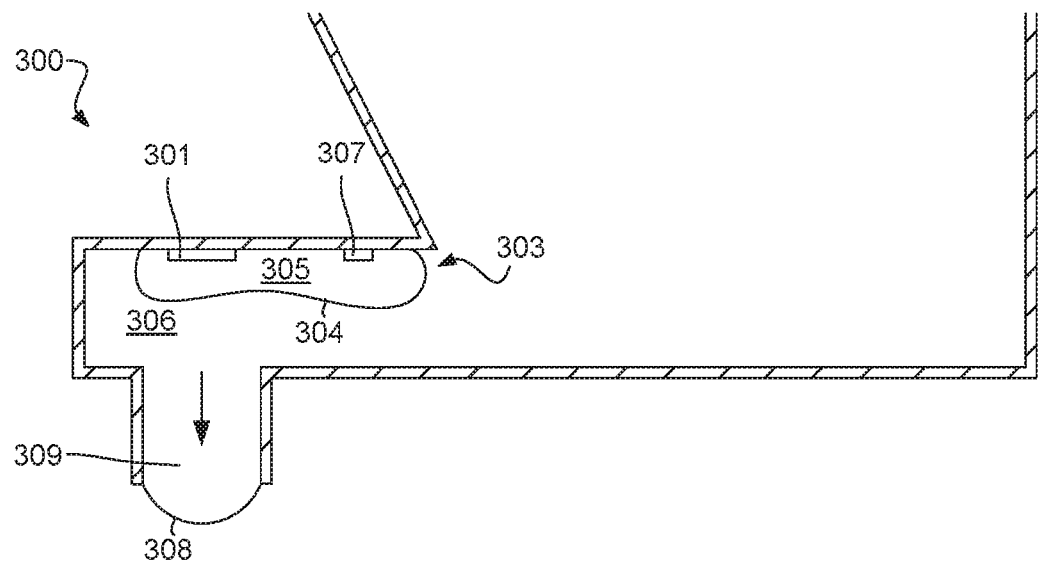
FIG. 3 is a cross sectional diagram of an illustrative ink chamber, according to principles described herein.

FIG. 3 is a cross sectional diagram of an illustrative ink chamber (300), according to principles described herein. In FIG. 3, a heater (301) in the ink chamber (300) is initiating drive bubble formation. A voltage is applied to the heater (301), and the heater's material resists the associated current flow driven by the voltage resulting in Joule heating. This heats the heater's material to a temperature sufficient to evaporate liquid ink in contact with the heater (301). As the ink evaporates, the ink in gaseous form expands forming a drive bubble (303). A bubble wall (304) separates the bubble's gas (305) from the liquid ink (306). In FIG. 3, the drive bubble (303) has expanded to such a volume that the heater (301) and the sensor (307) make physical contact just with the bubble's gas (305). Since the sensor is in contact with the bubble's gas (305), the sensor (307) measures an impedance value that indicates the drive bubble (303) is in contact with the sensor (307).

The expansion of the drive bubble (303) increases the internal pressure of the ink chamber (300). During the stage depicted in FIG. 3, the chambers internal pressure displaces enough ink to force the meniscus (308) within the nozzle's passage (309) to bow outward. However, at this stage, inertia continues to keep all of the liquid ink (306) together.

Figure 4:
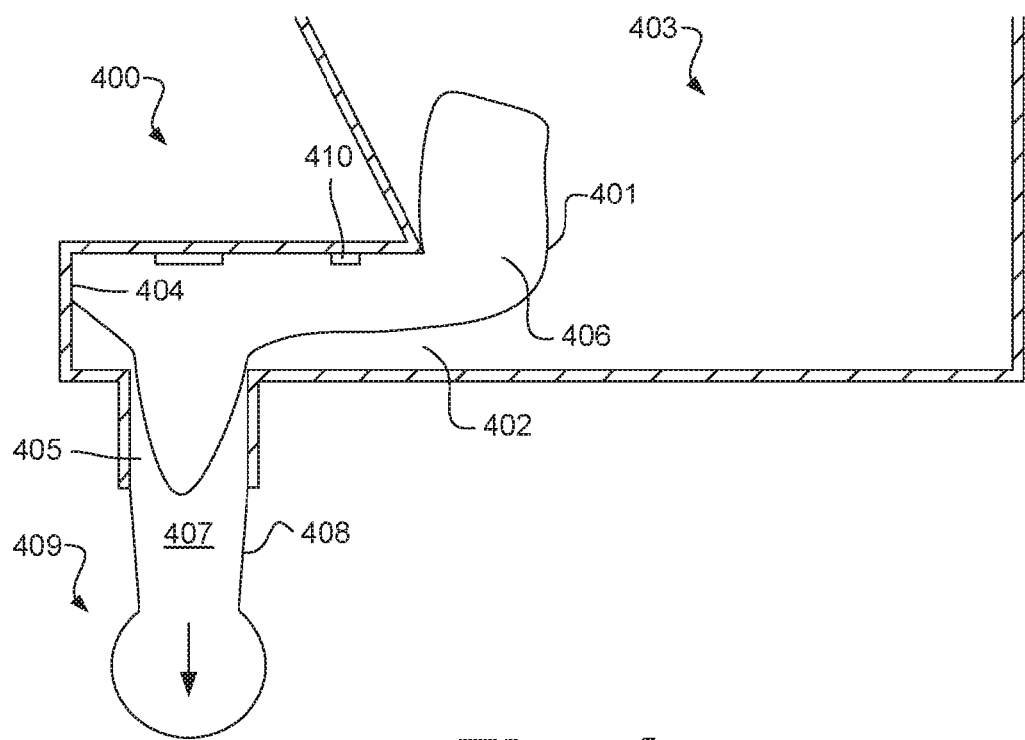
FIG. 4 is a cross sectional diagram of an illustrative ink chamber, according to principles described herein.

FIG. 4 is a cross sectional diagram of an illustrative ink chamber (400), according to principles described herein. In this figure, more time has passed from the initiation of the drive bubble, and the drive bubble's volume has continued to increase. At this stage, the drive bubble wall (401) extends through a chamber inlet (402) into an ink reservoir (403). On the other side of the chamber, the bubble wall (401) makes contact with the chamber's far wall (404). Another portion of the bubble wall (401) enters into the nozzle passage (405).

The drive bubble (406) may substantially isolate the liquid ink (407) in the chamber passage (405) from the rest of the ink chamber (400). As the drive bubble (406) continues to expand into the nozzle passage (405), the pressure in the nozzle passage (405) increases to such a degree that the liquid ink (407) in the passage (405) pushes the meniscus (408) out of the nozzle passage (405) increasing the meniscus's surface area. As the meniscus (408) increases in size, a droplet (409) forms that pulls away from the passage (405).

At this stage, the drive bubble (406) continues to cover the entire surface area of the sensor (410). Thus, the sensor (410) may measure the drive bubble's presence by measuring a higher resistance or impedance that the sensor (410) would otherwise measure if the sensor (410) were in contact with liquid ink (407).

Figure 5:
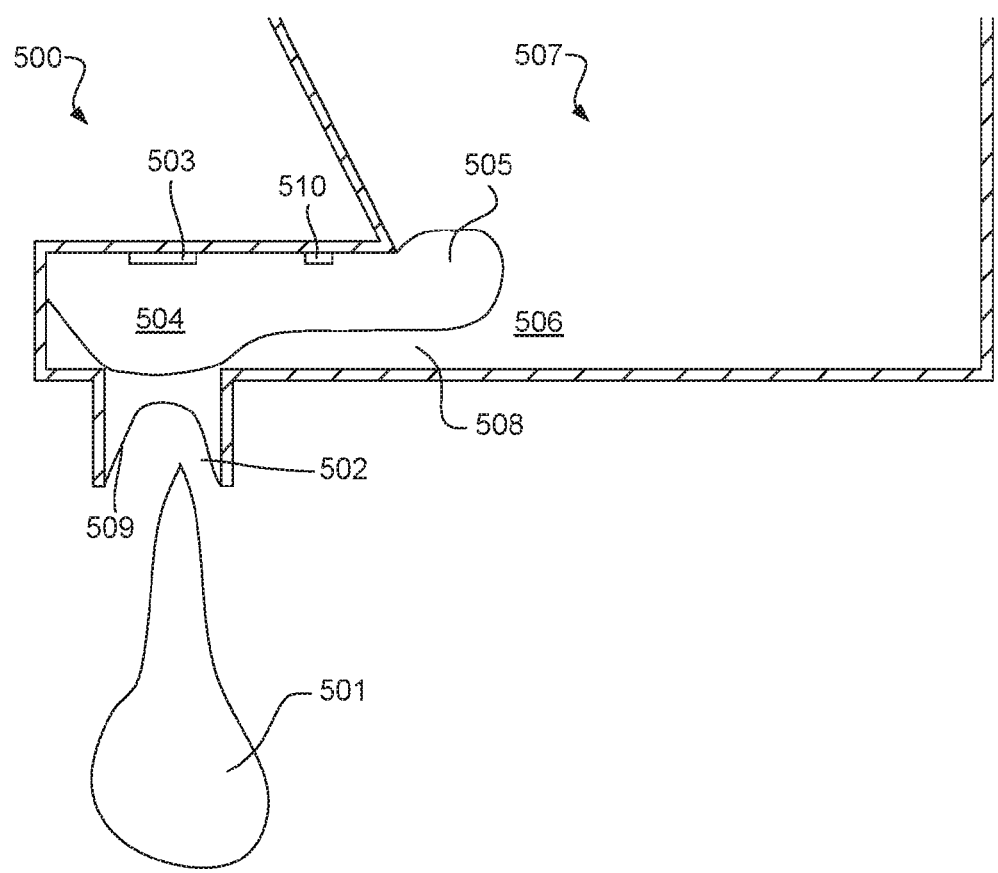
FIG. 5 is a cross sectional diagram of an illustrative ink chamber, according to principles described herein.

FIG. 5 is a cross sectional diagram of an illustrative ink chamber (500), according to principles described herein. In this example, the ink droplet (501) is breaking free from the nozzle passage (502) and the heater (503) is deactivating.

At this stage, the gas (504) of the drive bubble (505) cools in the absence of the heat from the heater (503). As the gas (504) cools, the drive bubble (505) shrinks, which depressurizes the ink chamber (500). The depressurization pulls liquid ink (506) from the ink reservoir (507) into the ink chamber (500) through the chamber inlet (508) to replenish the ink volume lost to the droplet release. Also, the meniscus (509) is pulled back into nozzle passage (502) due to the depressurization. The sensor (510) continues to measure a comparatively high impedance value because the drive bubble (505) continues to isolate the sensor (510) from the liquid ink (506).

Figure 6:
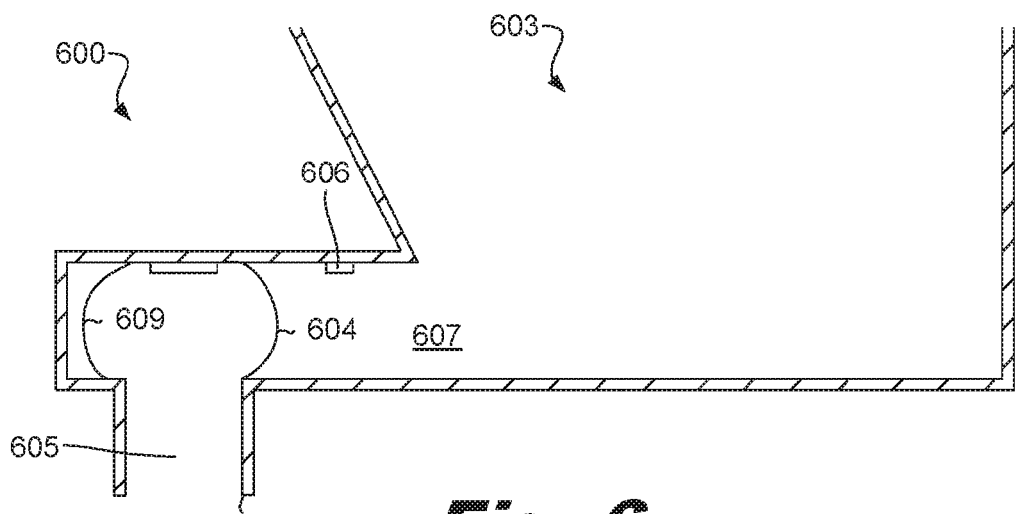
FIG. 6 is a cross sectional diagram of an illustrative ink chamber, according to principles described herein.

FIG. 6 is a cross sectional diagram of an illustrative ink chamber (600), according to principles described herein. In this figure, the drive bubble merges with the meniscus. As the internal pressure of the ink chamber (600) increases due to the ink flow from the reservoir (603), the bubble wall (604) is forced back towards the nozzle passage (605). During this bubble wall retraction, the reservoir side bubble wall (604) pulls away from the sensor (606). As the sensor (606) reestablishes contact with the liquid ink (607), the sensor measures a lower impedance value due to the higher electrical conductivity of the liquid ink (607).

At this stage under healthy operating conditions, the reservoir side bubble wall (604) resists a greater amount of pressure than the far bubble wall (609) due to the ink flow from the ink reservoir (603) reestablishing a pressure equilibrium in the ink chamber (600). The ink flow replenishes the lost ink volume, and the meniscus moves to the end (608) of the nozzle passage (605).

Again, FIGS. 3-6 depict an example of an illustrative healthy inkjet nozzle during an ink droplet release. However, many conditions may adversely affect the droplet release. For example, a blockage of the nozzle passage may prevent the formation of an ink droplet. The sensor measurements that result when a nozzle is blocked may show that the drive bubble forms normally, but that the drive bubble collapses more slowly than expected.

In other examples, a blockage of the ink chamber inlet may prevent ink from flowing from the ink reservoir to reestablish equilibrium within the ink chamber. In such a situation, the liquid ink may fail to come back into contact with the sensor. In other cases, the ink never enters the chamber during the priming process.

In some examples, liquid ink dries and solidifies on the heater becoming a thermal barrier that inhibits the heater's ability to vaporize the liquid ink. The thermal barrier may completely hinder the heater's ability to form a drive bubble or limit the heater to forming a smaller, weaker drive bubble than expected.

Also, the presence of a stray bubble may affect the ink droplet release. Sometimes air bubbles form in either the ink reservoir or in the chamber itself due to air or other gasses out-gassing from the ink. The mechanical compliance of a stray bubble may absorb some of the internal pressure intended to displace ink out of the nozzle passage and delay the droplet release. Further, a stray bubble's wall may deflect the drive bubble away from the nozzle passage in such a manner that the droplet fails to form or forms more slowly than expected.

Figure 7:
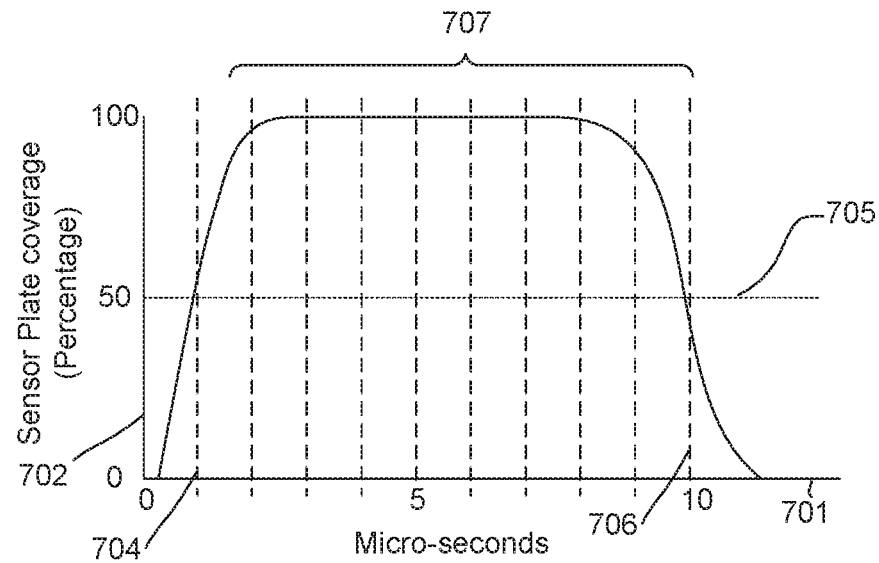
FIG. 7 is a diagram of an illustrative chart showing a bubble life span measured with a sensor, according to principles described herein.

FIG. 7 is an illustrative chart (700) showing a bubble life span measured with a sensor, according to principles described herein. In this example, the x-axis (701) schematically represents time in microseconds. Zero microseconds may correspond to the initiation of the drive bubble formation. The y-axis (702) may schematically represent the drive bubble's coverage of the sensor plate's surface area, which corresponds to the real portion of the impedance measurement. In this example, the chart shows a drive bubble that would result under healthy conditions.

The drive bubble's coverage depicted on the y-axis (702) may correspond to the impedance measurement taken by the sensor in the ink chamber over time. For example, a minimum impedance measurement may indicate that the entire surface area of the sensor is in contact with the ink and may correspond to zero percent surface area coverage on the y-axis (702). On the other hand, a maximum impedance measurement may indicate that the entire surface area of the sensor is in contact with the drive bubble and may correspond to a hundred percent surface area coverage on the y-axis (702). Impedance measurements between the minimum and maximum may indicate that a portion of the sensor's surface area is covered with liquid ink and another portion is covered by the drive bubble. In some examples, a higher impedance measurement indicates that a greater portion of the surface area is covered by the drive bubble. On the other hand, a lower impedance measurement may indicate that a majority of the surface area is a covered by liquid ink.

In this example, an impedance measurement is taken approximately every microsecond. In some examples, at least one measurement is taken every two microseconds.

In this example, the first measurement (704) is taken at about one microsecond after the drive bubble formation mechanism is activated. At the time that this first measurement is taken, the impedance value exceeds an impedance threshold value, schematically represented with line (705). At this threshold, the measurement signal may be converted to a "1" in binary code to indicate the presences of a drive bubble. When the first "1" is received, a processor may determine that the drive bubble is formed and record a drive bubble formation time. In the example of FIG. 7, the drive bubble formation time is at one microsecond. While the example of FIG. 7 shows a single measurement establishing a drive bubble formation time, in some examples, several measurements may be taken before a drive bubble formation time is determined.

In the example of FIG. 7, zero microseconds indicates the time that the drive bubble formation mechanism is activated. However, a time lapse between the activation of the drive bubble formation mechanism, which may be schematically represented at zero on the x-axis (701), and the formation of the drive bubble may exist. For example, in situations where a heater is used, there may be a time lapse due to the time it takes for the heater to reach a temperature sufficient to form a drive bubble. Also, in some examples, some ink may solidify on the surface of the heater from repeated exposure to high temperature. This solidified ink may be a thermal barrier that inhibits the heaters' ability to heat the surrounding liquid ink, which may result in a slower drive bubble formation time. In such an example, the drive bubble formation start time may change over the life of the nozzle and/or heater. Thus, periodic evaluation of a drive bubble's formation time may result in improved diagnostic programs that use the drive bubble's life span to determine the health of an inkjet nozzle.

In this example, subsequent measurements (707) taken from approximately two microseconds to nine microseconds are also over the threshold impedance value. Thus, these measurements also indicate the presence of a drive bubble.

In the example of FIG. 7, the measurement (706) taken at ten microseconds has an impedance value below the threshold value. As a consequence, the measurement signal may be converted to a "0" to indicate minimal or no detection of a drive bubble. At ten microseconds, the processor may determine that the drive bubble is collapsed due to the lower impedance measurement. In this example, the processor records ten microseconds as the bubble collapse time.

In some examples, taking measurements ceases once any measurement indicates a drive bubble collapse. However, in some examples, multiple measurements are taken after the first indication of a drive bubble collapse to ensure that the indication is accurate. In other examples, the measurements are taken until a determined time regardless of when the first indication of a drive bubble collapse. For example, measurements may be automatically taken from one to twenty microseconds even if the measurements starting at ten microseconds indicate that the drive bubble is collapsed.

In the example of FIG. 7, the impedance value that approximately equates to fifty percent plate coverage is used as the threshold level for indicating the presence or lack of presence of the drive bubble. However, in other examples, other threshold levels are used. For example, one to forty five percent sensor plate coverage may be used. In some examples, the threshold level is ten to twenty percent sensor plate coverage. In some examples, a threshold level above fifty percent coverage is used.

In some examples, the drive bubble collapse time changes over the life of the nozzle and/or drive bubble formation mechanism. As mentioned above, solidified ink on a surface of a drive bubble formation mechanism heater may affect the life of the drive bubble. Also, particles or stray bubbles may be introduced into the ink chamber that may semi-permanently reside in the ink chamber. While these particles or stray bubbles may not adversely affect an ink droplet release, they may affect the internal pressure of the ink chamber, which may affect either the drive bubble formation time and/or the drive bubble collapse time.

Figure 8:
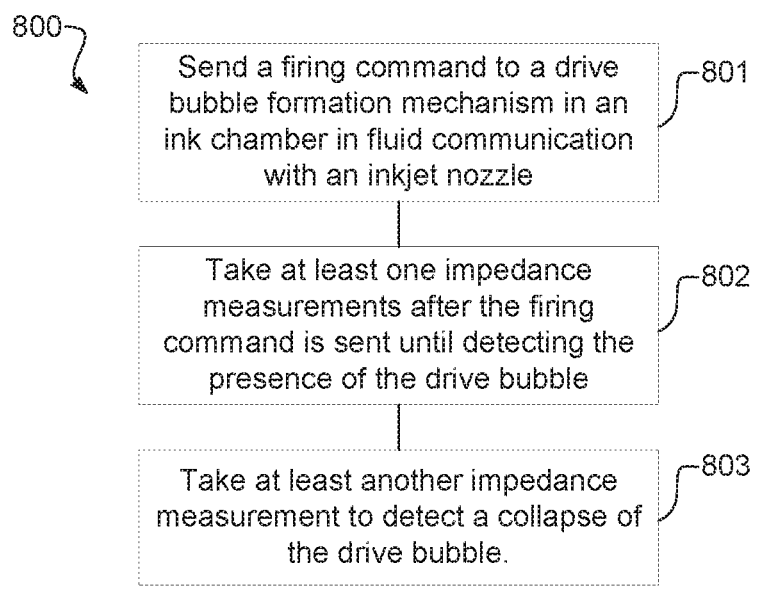
FIG. 8 is a diagram of an illustrative method for detecting a drive bubble, according to principles described herein.

FIG. 8 is a diagram of an illustrative method (800) for detecting a drive bubble, according to principles described herein. In this example, the method (800) includes taking (801) at least one impedance measurement after a firing command is sent until the presence of the drive bubble is detected and taking (802) at least another impedance measurement to detect a collapse of the drive bubble.

In some examples, the drive bubble formation time and/or the drive bubble collapse time may be recorded and stored in local memory. In some examples, the results of each measurement are also recorded and stored. In some examples, the results of the measurements or just the drive bubble formation and collapse times are sent to an off-chip location for further processing. In some examples, data from a first nozzle is stored locally. In some examples, data from multiple nozzles in the same print head is stored locally. The data from the first nozzle and/or other nozzles on the print head may be compressed prior to sending the data to an off-chip location. For example, duplicative data and/or data that may contribute little or no value for the processing may be removed prior to sending.

In some examples, the off-chip location is a location in a printer that contains the print head. A processor or chip in the print head may gather the drive bubble life span information including the drive bubble formation start time and the drive bubble collapse time, while another processor that is located elsewhere in the printer processes the information. The processor in the print head may have a limited size, thus, placing some of the processing circuitry off-chip may allow for more sophisticated processing.

In other examples, the off-chip location is a remote location connected to the printer through a network, such as a wireless network, the internet, a local area network, a telecommunications network, a private virtual network, or combinations thereof. In such examples, information from multiple print heads at different locations may be processed at a central location.

The method may be employed during an actual printing job. In this manner, circuitry that uses drive bubble life span data may have accurate information. In other examples, the method is performed initially, such as during a print head's manufacturing process. In some examples, the method is performed periodically over the life of the print head and/or nozzle. For example, the method may be performed once during a predetermined time period, such as once a week, a month, a group of months, a year, other time period, or combinations thereof. In other examples, the method is performed periodically on a usage basis. For example, the method may be performed once every predetermined number of nozzle firings, once every predetermined number of print jobs, or combinations thereof. In some examples, the method is performed whenever an issue with a nozzle health life is considered. For example, the method may be performed in a first nozzle when a second nozzle is suspected to be operating under an unhealthy condition. In some examples, the method is performed on demand, such as when a user requests performance of the method. In other examples, the performance of the method is tied to specific events, such as powering up a printer, receiving a low ink signal, receiving an error message, other event, or combinations thereof.

Figure 9:
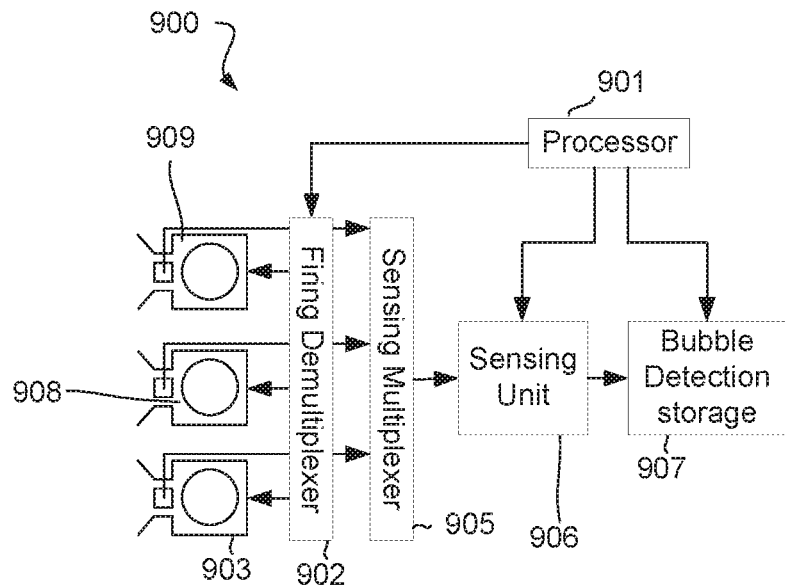
FIG. 9 is a diagram of illustrative circuitry for detecting a drive bubble, according to principles described herein.

FIG. 9 is a diagram of illustrative circuitry (900) for detecting a drive bubble, according to principles described herein. A processor (901) may control the timing for both firing the nozzle and taking measurements. In the example of FIG. 9, a processor (901) is in communication with a firing demultiplexer (902), which directs a firing command from the processor (901) to the predetermined nozzle (903). When the predetermined nozzle (903) receives the firing command, the drive bubble formation mechanism, such as a heater, initiates the formation of a drive bubble in the ink chamber.

A series of measurement commands may be sent to the predetermined nozzle after the firing command is sent. In some examples, measurement commands are sent automatically after the firing command.

In some examples, an amplifier is included in the circuitry (900) to amplify the measurement signal. Also, a digital to analog converter may convert the commands into an analog signal for taking the measurement, and an analog to digital converter may convert the measured signal back into a digital signal for processing.

The measurements taken in response to the measurement commands may be sent to a sensing multiplexer (905) that routes the signals to a sensing unit (906) in communication with the processor (901). The sensing unit (906) and the processor (901) may also be in communication with a bubble detection storage (907). Based on the measurement taken, the sensing unit (906) may determine whether drive bubble was detected for each measurement.

The bubble detection storage (907) may store the results from each measurement. However, in some examples, the bubble detection storage (907) stores just selected measurements that are deemed relevant for further processing. In some examples, just the drive bubble formation and collapse times are stored.

The bubble detection storage (907) may store the information until the information is request. In some examples, the processor (901) commands the bubble detection storage (907) to send the information. In other examples, other locations request the information directly from the bubble detection storage (907). In some examples, the bubble detection storage (907) stores the information for days, weeks, months, or longer before the information is requested. In some examples, the outdated information in the bubble detection storage (907) is replaced when updated information is received.

In the example of FIG. 9, the predetermined nozzle (903) is on a common print head with other nozzles (908, 909). The processor (901) may also be in communication with these nozzles (908, 909) and may also send them firing and measurement commands. In some examples, results from measurements taken from the nozzles (903, 908, 909) are sent to an off-chip location. In some examples, the results are compressed prior to sending the results. For example, in some cases, the drive bubble formation times may be the same for each of the nozzles. In such a case, a single drive bubble formation time may be sent. In some examples, a processor is programmed to compress a first drive bubble formation time of a first nozzle, a first drive bubble collapse time of the first nozzle, a second bubble formation time of a second nozzle, a second bubble collapse time of the second nozzle, and combinations thereof. The compression may remove data from the results that has minimal or no processing value prior to sending the results to another location.

Figure 10:
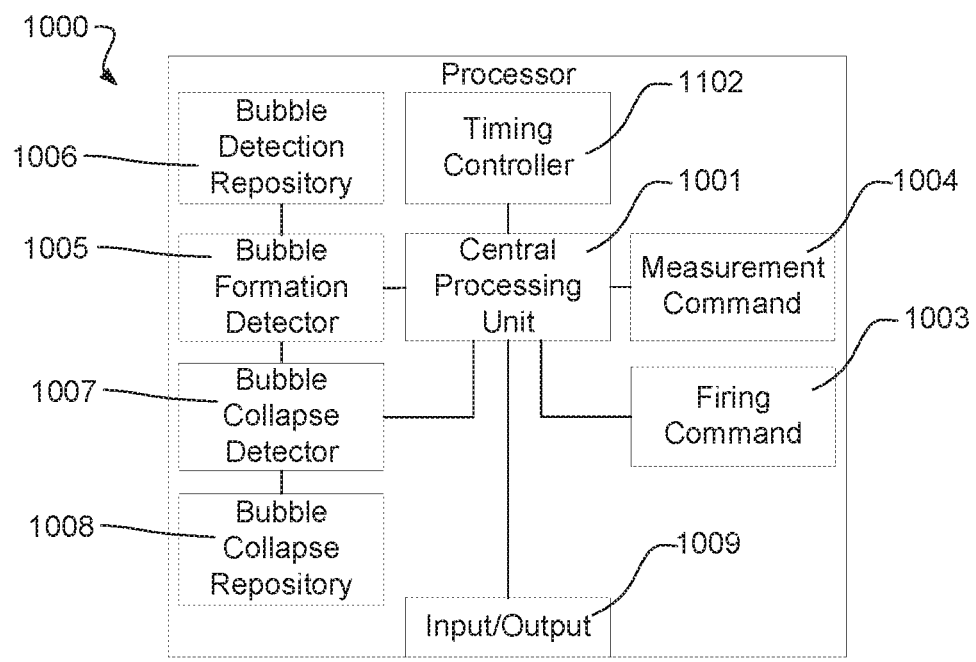
FIG. 10 is a diagram of an illustrative processor, according to principles described herein.

FIG. 10 is a diagram of an illustrative processor (1000), according to principles described herein. In this example, the processor (1000) has a central processing unit (CPU) (1001) that is controlled by a timing controller (1002). The CPU (1001) is in communication with an input/output (1009) to send commands and receive data. The CPU (1001) may communicate with a firing command (1003) to instruct a nozzle to fire by activating a drive bubble formation mechanism. After sending the firing command, the CPU (1001) may communicate with a measurement command (1004) to send an instruction to a sensor located within an ink chamber of the appropriate nozzle.

The measurement command may include instructions to take multiple measurements at specific times after firing the drive bubble formation mechanism to detect the presence of the drive bubble. In some examples, the time spacing between measurements may be periodic or may vary.

Upon receipt of the measurements taken in response to the measurement command, the CPU (1001) may send the received measurement to a bubble formation detector (1005), which may determine whether the measurements indicate the presences of a drive bubble. When the bubble formation detector (1005) determines that the drive bubble is formed, the bubble formation detector (1005) may record the time that the drive bubble was formed in a bubble formation repository (1006).

After the drive bubble formation time is determined, the processor (1001) may send the measurements to a bubble collapse detector (1007). Based on the measurements, the bubble collapse detector (1007) may determine when the drive bubble collapses. Once determined, the bubble collapse detector (1007) may record the drive bubble collapse time in a bubble collapse repository (1008).

In some examples, the processor also contains other repositories that store other information gathered from taking the measurements.

In some examples, the processor sends the information stored in the repositories to at least one off-chip location. In some examples, an off-chip location is another location in the same printer that has different processing capabilities.

Figure 11:
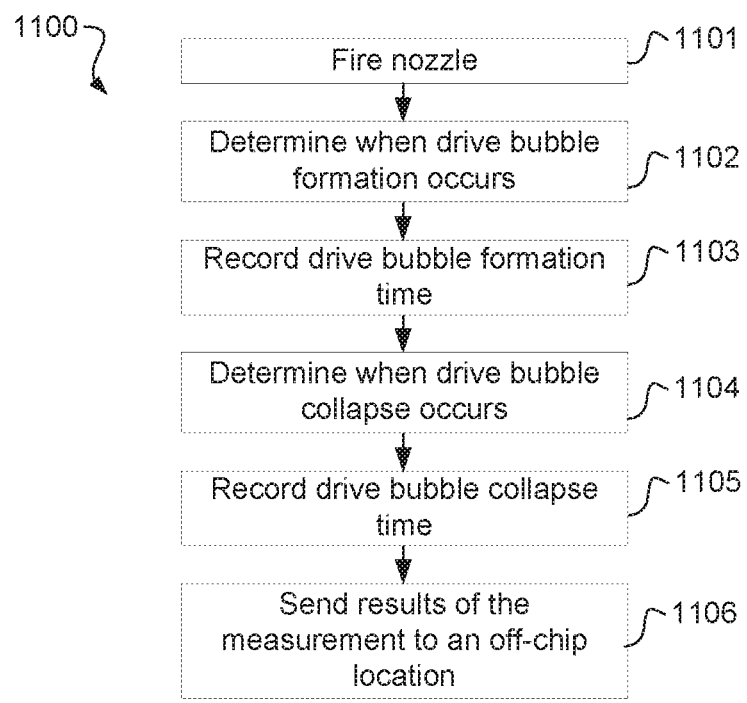
FIG. 11 is a diagram of an illustrative method for detecting a drive bubble, according to principles described herein.

FIG. 11 is a diagram of an illustrative method (1100) for detecting a drive bubble, according to principles described herein. In this example, the method includes firing (1101) the nozzle. The method (1100) also includes determining (1102) when a drive bubble formation occurs and recording (1103) the drive bubble formation time. The method (1100) also includes determining (1104) when a drive bubble collapse occurs and recording (1105) the drive bubble collapse time. Also, the method (1100) may include sending (1106) the results of the measurements to an off-chip location, like another processing location in the same printer.

While the principles herein have been described with specific ink chamber geometries, drive bubble formation mechanism placements, and sensor placements, any placement of components within or around the ink chamber and any geometry of the ink chamber are included within the scope of the principles described herein.

The preceding description has been presented only to illustrate and describe examples of the principles described. This description is not intended to be exhaustive or to limit these principles to any precise form disclosed. Many modifications and variations are possible in light of the above teaching.

What is claimed is:

1. An inkjet grin head, comprising:
    an ink chamber;
    a heater on a first surface of the ink chamber;
    an impedance sensor on the first surface of the ink chamber; and
    a counter electrode to be connected electrically with the impendence sensor by printing fluid in the ink chamber, wherein the impedance sensor is located between the heater and the counter electrode.

2. The printhead of claim 1, wherein the heater and the impedance sensor comprise a same material.

3. The printhead of claim 1, wherein the counter electrode is ground.

4. The printhead of claim 1, wherein the impedance sensor outputs a real component of impedance between the impedance sensor and the counter electrode.

5. The printhead of claim 1, wherein the counter electrode is not located between the heater and a firing nozzle, where the firing nozzle ejects a bubble generated by the heater.

6. The printhead of claim 1, further comprising a memory for storing measurements of a drive bubble.

7. The printhead of claim 5, wherein the counter electrode is protected from contact with the drive bubble by an overhang.

8. The printhead of claim 6, the memory to store manufacturing test data for the printhead.

9. The printhead of claim 8, the printhead to compare a drive bubble measurement with the manufacturing test data for the printhead stored in the memory.

10. The printhead of claim 9, the printhead to compare an impedance value with a threshold value.

11. The printhead of claim 10, the printhead to output a binary signal as a result of a comparison of an impedance value with a threshold value.

12. A method of operating an inkjet printhead, wherein the printhead, comprises:
    an ink chamber;
    a heater on a first surface of the ink chamber;
    an impedance sensor on the first surface of the ink chamber; and
    a counter electrode to be connected electrically with the impendence sensor by printing fluid in the ink chamber, the method comprising:
    measuring an impedance between the heater and a counter electrode with the impedance sensor;

measuring a time lapse from a firing signal being provided to the heater until a drive bubble is detected by a sensor; and selectively providing notification to a user of buildup of material on the heater based on the measured impedance and time lapse.

13. The method of claim 12, wherein the sensor also serves as the counter electrode.

14. The method of claim 12, further comprising receiving information from a manufacturing test performed on the printhead.

15. The method of claim 14, wherein the information is received from a memory on the printhead.

16. An inkjet printhead, comprising:
an ink chamber;
a heater on a first surface of the ink chamber;
an impedance sensor on the first surface of the ink chamber; and
a counter electrode to be connected electrically with the impendence sensor by printing fluid in the ink chamber, wherein the counter electrode is not located between the heater and a firing nozzle, where the firing nozzle ejects a bubble generated by the heater and the counter electrode is protected from contact with the drive bubble by an overhang.

17. The printhead of claim 16, wherein the heater and the impedance sensor comprise a same material.

18. The printhead of claim 16, wherein the counter electrode is ground.

19. The printhead of claim 16, further comprising a memory for storing measurements of a drive bubble.

* * * * *

UNITED STATES PATENT AND TRADEMARK OFFICE
CERTIFICATE OF CORRECTION

PATENT NO. : 9,950,517 B2  
APPLICATION NO. : 15/170588  
DATED : April 24, 2018  
INVENTOR(S) : Eric T. Martin et al.

Page 1 of 1

It is certified that error appears in the above-identified patent and that said Letters Patent is hereby corrected as shown below:

In the Claims

Column 10, Claim 1, Line 23, delete "grin head," and insert -- printhead, --, therefor.

Column 10, Claim 12, Line 64, delete "chamber," and insert -- chamber; --, therefor.

Signed and Sealed this
Sixteenth Day of April, 2019

Andrei Iancu
*Director of the United States Patent and Trademark Office*